United States Patent
Lakhotkin et al.

(10) Patent No.: US 7,022,403 B1
(45) Date of Patent: Apr. 4, 2006

(54) ADHESIVE COMPOSITE COATING FOR DIAMOND AND DIAMOND-CONTAINING MATERIALS AND METHOD FOR PRODUCING SAID COATING

(75) Inventors: Jury V. Lakhotkin, Moscow (RU); Vladimir P. Kuzmin, Moscow (RU)

(73) Assignee: Hardide Limited, (GB)

( * ) Notice: Subject to any disclaimer, the term of this patent is extended or adjusted under 35 U.S.C. 154(b) by 0 days.

(21) Appl. No.: 10/221,395

(22) PCT Filed: Mar. 15, 2000

(86) PCT No.: PCT/RU00/00086

§ 371 (c)(1),
(2), (4) Date: Jan. 24, 2003

(87) PCT Pub. No.: WO01/68559

PCT Pub. Date: Sep. 20, 2001

(51) Int. Cl.
*B23B 15/00* (2006.01)
*C23C 10/32* (2006.01)

(52) U.S. Cl. .......... 428/216; 427/255.2; 427/255.7; 428/336; 428/408; 428/469; 428/472; 428/698

(58) Field of Classification Search .......... 428/408, 428/216, 336, 469, 472, 698; 427/255.2, 427/255.7
See application file for complete search history.

(56) References Cited

U.S. PATENT DOCUMENTS

| 4,063,907 A | 12/1977 | Lee et al. ............ 51/295 |
| 4,902,262 A | 2/1990 | Lunsford ............ 501/90 |
| 4,980,201 A * | 12/1990 | Tokunaga et al. ...... 427/249.18 |
| 5,006,371 A * | 4/1991 | Garg et al. ............ 427/249.17 |
| 6,800,383 B1 | 10/2004 | Lakhotkin et al. |

FOREIGN PATENT DOCUMENTS

| JP | 06 173009 | * 6/1994 |
| RU | 1604807 | 11/1990 |
| RU | 1731763 | 5/1992 |

* cited by examiner

*Primary Examiner*—Archene Turner
(74) *Attorney, Agent, or Firm*—Sheridan Ross P.C.

(57) ABSTRACT

The inventive coating for diamond and diamond-containing materials represents a coupling of an internal layer, made of tungsten carbide, with an external tungsten layer, both layers being fluorine alloyed. The inventive coating makes it possible to ensure a good adhesion of diamonds and diamond-containing materials to a backing. Methods for applying said coatings are also disclosed.

26 Claims, No Drawings

ADHESIVE COMPOSITE COATING FOR DIAMOND AND DIAMOND-CONTAINING MATERIALS AND METHOD FOR PRODUCING SAID COATING

FIELD OF THE INVENTION

The invention relates to a composite surface system on materials which contain natural and synthetic diamonds. It provides high adhesion to the binder in diamond tools and articles, and high resistance to wear and chemicals. More specifically, the invention relates to a composite multi-layer coating on natural or synthetic diamonds or diamond-bearing materials with improved adhesion to the metal binder in tools or articles. It consists of an external tungsten layer and internal tungsten carbide layers.

PRIOR ART

In the operation of a diamond tool, some diamond grains which still retain working capacity break away from the binder and fall out of the tool. Some diamond grains are fractured and destroyed due to the presence of surface cracks and pores. Therefore, the diamond tool does not last so long in a usable condition.

The falling out of the diamond grains is the result of their weak adhesion to the binder used to fix the grains in the tool. Brittle fracture develops as cracks spread in the diamond crystals due to stresses which occur during the use of tools or articles resulting from defects in the diamonds used in industry (presence of surface pores and micro-cracks). Therefore, one of the ways of improving the performance of a diamond tool is to increase the bond strength between the diamond grain and the matrix (binder) in the diamond tool and to increase the strength of the diamond grain itself (strengthening the faulty surface of a diamond grain). Another aim is to increase the adhesion of jewelry-cut diamonds to their setting in the course of bring them in.

Adhesive coatings are applied to the diamond grain to increase adhesion of the grain to metal and ceramic matrices, e.g., coatings consisting of metals of the iron group (nickel, cobalt and their alloys), which, however, do not ensure good adhesion of diamond to these coatings. Furthermore, metals of the iron group stimulate the conversion of diamond into graphite at high temperature, i.e., under the effect of these metals, the diamond decreases in volume. A widely used and simple method of applying these coatings is electrochemical or chemical deposition from aqueous solutions.

For example, international application WO 97/09469 describes a process for the production of a pencil-like diamond tool by metallisation of a structure with embedded diamond grains by electrolytic nickel. Electrolytic nickel is an adhesive coating by means of which the diamond grains are bonded to the metal binder in the tool. However, the strength of adhesion of the nickel coating to diamond does not differ substantially from the adhesion of the metal binder to diamond, as the binder is usually produced from a copper-nickel alloy.

Carbide-forming coatings are applied to the surface of industrial diamonds to increase durability of machining, correcting and drilling tools. Almost all transition metals—Ti, Zr, V, Nb, Cr, Mo—interact actively with diamond by forming the corresponding carbides. But the resultant carbides have insufficient protective properties (the rate of diffusion of the carbon through the carbide is high, which causes graphitisation of the diamond and thus loss of strength; and the mechanical properties of the carbides at high operating temperatures of the diamond tool are low).

Tungsten can be a unique protective material, since its carbides have maximum strength properties at high temperatures and are an excellent barrier against carbon diffusion due to the extreme forces of the inter-atomic bond of tungsten and diamond. For example, PCT/US96/12462 describes strengthening of tools that contain diamonds, which are coated with materials that contain particles of tungsten carbide, and tungsten carbide with cobalt or metal-ceramics, such as carbides and nitrides of metals. The particles are introduced into the coating by a metallurgical method, e.g. by welding. As a rule, the adhesion of the combined layer to a diamond particle is not strong. On the other hand, the mechanical properties of the diamond particles deteriorate at sintering temperature, especially when synthetic diamonds are used.

The patent GB 614396 describes a process for the metallisation of diamonds or similar refractory materials. It consists of chemical cleaning by, for example, carbon tetrachloride, physical cleaning by ion bombardment in a vacuum and deposition of the required metal. However, the physical vapour deposition method is not ideal for strengthening diamonds, since the clusters of ionised particles are not introduced into the cracks and other shaded slit defects on the surface of the diamond, so this surface is not cemented. On the other hand, adhesion of physically deposited films to diamond is low, in spite of well-developed surface cleaning processes, since the adhesive carbide layer is not usually formed by this method. Only the chemical vapour deposition method can solve the problem of good adhesion to diamond, as well as its strengthening by healing its surface defects.

PCT/GB99/02900 describes the strengthening of diamond grains used in tools by the application of a diamond film, which fills the surface defects of industrial diamonds. However, the diamond coating surface has low adhesion strength to the metal matrix in the production of a diamond tool.

SUBSTANCE OF THE INVENTION

The aim of the present invention is to strengthen the faulty surfaces of natural and synthetic diamonds and their compositions, and at the same time to enhance their adhesion to the binder in the diamond tool or article. These aims are achieved by the application of tungsten carbide coatings to diamonds and diamond-bearing materials at low temperatures, at which the mechanical properties of diamonds or their compositions are not affected.

One of the aspects of the present invention is a coating of diamond particles or diamond-bearing materials which may be single-layer tungsten or single-phase tungsten carbide, consisting of tungsten monocarbide WC, where both the tungsten and the tungsten monocarbide are alloyed with fluorine in a quantity of 0.0004 to 0.3 wt %.

The coating may be a bilayer coating, the internal layer being tungsten monocarbide and the external layer tungsten.

The coating may be a multilayer (multilaminar) coating, containing an external tungsten layer and internal tungsten carbide layers. On top of the diamond-bearing substrate and the internal layer of tungsten monocarbide, the coating may contain successive layers of tungsten semi-carbide $W_2C$, tungsten subcarbide $W_3C$, a mixture of tungsten subcarbides $W_3C$ and $W_{12}C$, and tungsten subcarbide $W_{12}C$. The adhesive multilayer coating may lack the external tungsten layer.

The thickness ratio of the internal carbide layer to the external metal tungsten layer may vary from 1.1 to 1:100 for a thickness of the said coating layers from 0.1 to 10 µm.

The functions of the individual layers of the multilayer composite coating differ. The external tungsten layer ensures the best adhesion to the metal binder in the diamond tool or article. Replacement of tungsten with its carbides in the external layer causes deterioration of adhesion in the binder. The internal layer of tungsten monocarbide is necessary to ensure adhesion of the composite coating to the diamond-bearing materials. The intermediate layer may contain tungsten semicarbide or the whole set of intermediate carbides, $W_2C$, $W_3C$ and $W_{12}C$, to provide a smooth gradient of carbon content from tungsten monocarbide to metallic tungsten, and to ensure adhesion of the internal layer to the external one. Furthermore, the compound effect of strengthening is implemented more radically with the multilayer coating.

The formation of the carbide phase starts on the defective areas of the diamond surface. This results in the partial filling of defects in the diamond surface with tungsten carbides and in the strengthening of the crystals. On the other hand, as the carbide layers form, they limit the further progression of carbon diffusion from the diamond grain into the coating, thus preventing loss of strength in the diamond crystal.

Another aspect of the present invention is the process of the application of the said coatings to a substrate consisting of diamonds and diamond-bearINing materials.

The diffusion method, which is often used for metallisation of diamonds by the said transitional refractory metals, is not used for tungsten metallisation, since it requires a heating temperature of over 1400° C. It is known that at temperatures over 1100° C., almost all groups of industrial synthetic and natural diamonds loss strength.

To reduce the temperature of the application of tungsten carbide coatings by the diffusion process, the use of a special charge, which makes it possible to ensure the growth of tungsten carbide composite coatings on diamonds at an acceptable rate at a temperature of 700° C. or higher, is suggested.

The proposed charge contains tungsten powder with or without an inert filler, for example aluminium oxide, and with fluorine-containing materials within the limits 0.003–5.0 wt %. The composition and thickness of the multilayer coating are varied by varying the time and temperature at which the diamond crystals are held in the charge, as well as the content of fluorine in the charge.

Diamond grit or diamond-bearing articles are mixed with the tungsten charge with or without inert fillers and with fluorine content within limits 0.003–5.0 wt %, and are placed in an alundum crucible. The crucible is placed in a vacuum furnace, which is pumped out to a pressure of not more than 0.01 Pa. The furnace is heated to the specified temperature and is held at it for the time necessary for the creation of a multilayer tungsten carbide coating of the required thickness on the diamond surfaces. After this, the furnace with the crucible is cooled to room temperature with continuous evacuation. The crucible is taken out of the furnace and the charge of diamond articles is taken out of the crucible. The diamond articles are then separated from the charge by sifting.

Another process for applying the said multilayer tungsten carbide coating is to hold the diamond crystals or other diamond-bearing materials in a chemical vapour deposition reactor in a medium of tungsten hexafluoride and hydrogen at a temperature of 400–800° C. and at a reaction mixture pressure of 2–150 kPa. The reaction mixture may contain an inert gas, for example argon, up to 95% by volume, Hydrogen content can be up to 99% and tungsten hexafluoride content up to 30%.

Diamond grit and diamond-bearing articles with the surface degreased and cleaned of all contamination are placed in a direct-flow chemical vapour deposition reactor, which is equipped with an electric heater and mixer. The chemical reactor is evacuated with the aid of a roughing pump with a nitrogen freezing-out trap up to maximum rarefaction, after which hydrogen or argon is supplied to the reactor. After this, the mixer is switched on and the reactor with diamond articles is heated to the required temperature. It is held at this temperature for 0.5–1 hours. Then the necessary hydrogen flow rate and the required general pressure in the reactor are set. After this, the required flow rate of tungsten hexafluoride, preheated to 30° C., is set.

The diamond grit or other diamond-bearing articles are constantly agitated and held at the specified conditions during the period required for the application of the tungsten layer. The supply of tungsten hexafluoride is then stopped and the grit or articles are heated up to a higher temperature (annealed) and held there for the period required for the creation of the inner tungsten carbide layer. After this, the reactor is cooled to room temperature with continuous supply of hydrogen or argon and agitation. Then the supply of hydrogen or argon is stopped and air is let into the reactor. The crucible with diamond grit or articles is then taken out of the reactor.

EXAMPLES

Example 1

A tungsten charge with fluorine content of 0.1 wt % and natural diamonds of size 30–50 to the carat, taken in a volume ratio of 10:1, are held in a vacuum of 0.01 Pa at a temperature of 750° C. for 1.5 hrs., as a result of which a tungsten coating of 1.2 µm thickness with fluorine content of 0.004 wt % is deposited on diamonds.

Example 2

A tungsten charge with an inert filler containing 1 wt % of fluorine and natural diamonds, of size 20–30 to the carat, taken in a volume ratio of 10:1:1, are held in a vacuum of 0.01 Pa at a temperature of 1100° C. for 10 min. As a result, a coating of tungsten monocarbide WC of 0.2 µm thickness and fluorine content of 0.008 wt % is deposited on the diamonds.

Example 3

A tungsten charge with an inert filler, which contains 0.85 wt % of fluorine, and natural diamonds, of size 20–30 to the carat, taken in a volume ratio of 10:1:1, are held in a vacuum of 0.01 Pa at a temperature of 1050° C. for 1 hr. As a result, a coating of tungsten monocarbide with an external tungsten layer, of total thickness 2.5 µm and total fluorine content of 0.008 wt %, is deposited on the diamonds.

Example 4

A tungsten charge with fluorine content of 0.7 wt % and synthetic diamonds, of size 400–315 µm, taken in a volume ratio of 12.1, are held in a vacuum of 0.01 Pa at a temperature of 1050° C. for 11 min. As a result, a bilayer coating of tungsten monocarbide WC and tungsten semi-carbide $W_2C$ with total thickness of 0.15 μm and total fluorine content of 0.009 wt % is deposited on the diamonds.

Example 5

A tungsten charge with an inert filler which contains 0.54 wt % of fluorine, and synthetic diamonds, of size 160–125 μm, taken in a volume ratio of 15:2:1, are held in a vacuum of 0.01 Pa at a temperature of 980° C. for 19 min. As a result, a multilayer coating of monocarbide WC, semi-carbide $W_2C$ and tungsten subcarbide $W_3C$ with a total thickness of 0.22 μm and total fluorine content of 0.01 wt % is deposited on the diamonds.

Example 6

A tungsten charge with fluorine content of 0.45 wt % and synthetic diamonds, of size 315–250 μm, taken in a volume ratio of 14:1, are held in a vacuum of 0.01 Pa at a temperature of 950° C. for 1.5 hrs. As a result, a multilayer coating of monocarbide WC, semi-carbide $W_2C$, tungsten subcarbide $W_3C$ and an external tungsten layer with a total thickness of 7.3 μm and total fluorine content of 0.0011 wt % is deposited on the diamonds.

Example 7

Natural diamonds, of size 30–50 to the carat, are held in a chemical vapour deposition reactor in a mixture of tungsten hexafluoride and hydrogen in a volume ratio of 1:50 at a temperature of 550° C. and total reaction mixture pressure of 4 kPa for 30 min. The reactor is then evacuated to 0.01 Pa and the diamond crystals with the formed tungsten coating of 7 μm thickness are annealed at a temperature of 1120° C. for 30 min. As a result, a bilayer coating of tungsten monocarbide WC and external tungsten layer with a total fluorine content of 0.005 wt % is formed.

Example 8

Natural diamonds, of size 20–30 to the carat, are held in the said reactor in a mixture of tungsten hexafluoride and hydrogen in a volume ratio of 1:40 at a temperature of 600° C. and total reaction mixture pressure of 4 kPa for 25 min. The reactor is then evacuated to 0.01 Pa and the diamond crystals with the formed tungsten coating of 9 μm thickness are annealed at a temperature of 1030° C. for 45 min. As a result, a multilayer coating of tungsten mono-carbide WC, tungsten semi-carbide $W_2C$ and external tungsten layer with a total fluorine content of 0.006 wt % is formed.

Example 9

Synthetic diamonds, of size 400–315 μm, are held in the said reactor in a mixture of hexafluoride and hydrogen in a volume ratio of 1:50 at a temperature of 570° C. and total reaction mixture pressure of 4 kPa for 20 min. The reactor is then evacuated to 0.01 Pa and the diamond crystals with the formed tungsten coating of 5 μm thickness are annealed a temperature of 900° C. for 1 hr. As a result, a multilayer coating of tungsten monocarbide WC, tungsten semi-carbide $W_2C$, mixture of tungsten subcarbide $W_3C$ and $W_{12}C$, and external tungsten layer with a total fluorine content of 0.009 wt % is formed.

INDUSTRIAL APPLICABILITY

Compressive fracture strength tests of natural diamonds with the coating applied in accordance with the present invention (the crush method) have shown strength increase of diamond grains averaging 12% in comparison with non-coated diamond crystals. It is recommended that this invention be used for the production of crown and other drilling bits and cutters. Production tests of drilling bits with natural diamond crystals coated in accordance with the present invention have shown an increase of drilling speed or depth of penetration by 50% without replacement of the drill bit.

The use of diamonds coated by tungsten and tungsten carbides during production of a single-crystal tool looks promising. It is recommended that synthetic diamonds or their sintered agglomerates coated with tungsten carbides be used to produce cutting tools. For example, diamond saws with synthetic diamond grit coated in accordance with the proposed invention have shown twice the durability of non-coated ones.

What is claimed is:

1. A coating on diamonds and diamond-bearing materials comprising a layer of tungsten alloyed with fluorine in an amount of 0.0004 to 0.3 wt %.

2. A coating on diamonds and diamond-bearing materials comprising a layer of tungsten monocarbide WC alloyed with fluorine in the amount of 0.0004 to 0.3 wt % and a tungsten layer alloyed with fluorine in the amount of 0.0004 to 0.3 wt % applied on top of the said layer of tungsten monocarbide.

3. A coating in accordance with claim 2, wherein the tungsten carbide layer has a thickness of 0.1–10 μm and the tungsten layer has a thickness of 0.1–10μm with a thickness ratio of the tungsten carbide to tungsten layers being from 1:1 to 1:100.

4. A coating comprising a layer of tungsten monocarbide WC alloyed with fluorine in the amount of 0.0004 to 0.3 wt %, a layer of tungsten semi-carbide $W_2C$ alloyed with fluorine in the amount of 0.0004 to 0.3 wt % applied on top of the said layer of tungsten monocarbide, and a tungsten layer alloyed with fluorine in the amount of 0.0004 to 0.3 wt % applied on top of the said layer of tungsten semi-carbide.

5. A coating comprising a layer of tungsten monocarbide WC alloyed with fluorine in the amount of 0.0004 to 0.3 wt %, a layer of tungsten semi-carbide $W_2C$ alloyed with fluorine in the amount of 0.0004 to 0.3 wt % applied on top of the said layer of tungsten monocarbide, a layer of tungsten subcarbide $W_3C$ alloyed with fluorine in the amount of 0.0004 to 0.3 wt % applied on top of the said layer of tungsten semi-carbide, and a tungsten layer alloyed with fluorine in the amount of 0.0004 to 0.3 wt % applied on top of the said layer of tungsten subcarbide.

6. A coating comprising a layer of tungsten monocarbide WC alloyed with fluorine in the amount of 0.0004 to 0.3 wt %, a layer of tungsten semi-carbide $W_2C$ alloyed with fluorine in the amount of 0.0004 to 0.3 wt % applied on top of the said layer of tungsten monocarbide, a layer of tungsten subcarbide $W_3C$ alloyed with fluorine in the amount of 0.0004 to 0.3 wt % applied on top of the said layer of tungsten semi-carbide, a layer of tungsten subcarbide $W_{12}C$ alloyed with fluorine in the amount of 0.0004 to 0.3 wt % applied on top of the said layer of tungsten subcarbide $W_3C$ and a tungsten layer alloyed with fluorine in the amount of 0.0004 to 0.3 wt % applied on top of the said layer of tungsten subcarbide $W_2C$.

7. A coating comprising a layer of tungsten monocarbide WC alloyed with fluorine in the amount of 0.0004 to 0.3 wt %, a layer of tungsten semi-carbide $W_2C$ alloyed with fluorine in the amount of 0.0004 to 0.3 wt % applied on top of the said layer of tungsten monocarbide, a layer of tungsten subcarbide $W_{12}C$ alloyed with fluorine in the amount of 0.0004 to 0.3 wt % is applied on top of the said layer of tungsten semi-carbide $W_2C$ and a tungsten layer alloyed with fluorine in the amount of 0.0004 to 0.3 wt % applied on top of the said layer of tungsten subcarbide $W_{12}C$.

8. A process for applying a coating to a substrate consisting of diamonds or diamond-bearing materials, comprising placing the substrate in a medium of a charge containing an inert filler and at least one of an alloy consisting of powdered tungsten alloyed with fluorine, the powdered tungsten alloyed with fluorine comprising 0.003–5 wt % of the total weight of the charge, and heating to 700–1200° C.

9. A process in accordance with claim 8, wherein the process is carried out at a temperature of 700–800° C. in a charge with a powdered tungsten alloyed with fluorine content of 0.003–0.7 wt %, producing a coating of tungsten alloyed with fluorine.

10. A process in accordance with claim 8, wherein the process is carried out at 950–1200° C. in a charge with a powdered tungsten alloyed with fluorine content of 0.05–3 wt % for approximately 10 minutes, producing a coating consisting of tungsten monocarbide WC alloyed with fluorine.

11. A process in accordance with claim 8, wherein the process is carried out at 950–1200° C. in a charge with a powdered tungsten alloyed with fluorine content of 0.05–3 wt % for more than 10 minutes, producing a coating consisting of an internal layer of tungsten monocarbide WC and an external layer of tungsten.

12. A process in accordance with claim 8, wherein the process is carried out at 920–1150° C. in a charge with a powdered tungsten alloyed with fluorine content of 0.01–2.5 wt % for approximately 12 minutes, producing a coating of tungsten monocarbide WC and tungsten semi-carbide $W_2C$.

13. A process in accordance with claim 8, wherein the process is carried out at 920–1150° C. in a charge with a powdered tungsten alloyed with fluorine content of 0.01–2.5 wt % for more than 12 minutes, producing a coating consisting of an internal layer containing tungsten monocarbide WC and tungsten semi-carbide $W_2C$, and an external tungsten layer.

14. A process in accordance with claim 8, wherein the process is carried out at 900–1100° C. in a charge with a powdered tungsten alloyed with fluorine content of 0.008–2.0 wt % for approximately 15 minutes, producing a coating containing tungsten monocarbide WC, tungsten semi-carbide $W_2C$ and tungsten subcarbide $W_3C$.

15. A process in accordance with claim 8, wherein the process is carried out at 900–1100° C. in a charge with a powdered tungsten alloyed with fluorine content of 0.008–2.0 wt % for more than 15 minutes, producing a coating consisting of an internal layer containing tungsten monocarbide WC, tungsten semi-carbide $W_2C$ and tungsten subcarbide $W_3C$, and an external tungsten layer.

16. A process in accordance with claim 8, wherein the process is carried out at 850–1050° C. in a charge with a powdered tungsten alloyed with fluorine content of 0.005–1.5 wt % for approximately 17 minutes, producing a coating containing tungsten mono-carbide WC, tungsten semi-carbide $W_2C$ and a mixture of tungsten sub-carbides $W_3C$ and $W_{12}C$.

17. A process in accordance with claim 8, wherein the process is carried out at 850–1050° C. in a charge with a powdered tungsten alloyed with fluorine content of 0.005–1.5 wt % for more than 17 minutes, producing a coating consisting of an internal layer containing tungsten mono-carbide WC, tungsten semi-carbide $W_2C$ and a mixture of tungsten sub-carbides $W_3C$ and $W_{12}C$, and an external tungsten layer.

18. A process in accordance with claim 13, wherein the process is carried out at 800–1000° C. in a charge with a powdered tungsten alloyed with fluorine content of 0.004–1.0 wt % for approximately 20 minutes, producing a coating layer containing tungsten mono-carbide WC, tungsten semi-carbide $W_2C$ and tungsten subcarbide $W_{12}C$.

19. A process in accordance with claim 14, wherein the process is carried out at 800–1000° C. in a charge with a powdered tungsten alloyed with fluorine content of 0.004–1.0 wt % for more than 20 minutes, producing a coating consisting of an internal layer containing tungsten monocarbide WC, tungsten semi-carbide $W_2C$ and tungsten subcarbide $W_{12}C$, and an external tungsten layer.

20. A process for applying a coating to a substrate consisting of diamonds or diamond-bearing materials, comprising the following steps:
a) placing the diamond substrate in a chemical vapour deposition reactor with a mixer,
b) evacuating the reactor to 10 Pa,
c) heating the said substrate,
d) supplying tungsten hexafluoride and hydrogen to the reactor,
e) holding the substrate for such time as is necessary to form the tungsten layer on the substrate,
f) shutting off the supply of tungsten hexafluoride arid hydrogen,
g) evacuating the reactor to 0.01 Pa,
h) reheating (annealing) of the substrate up to the temperature necessary to form tungsten carbides,
i) and holding the substrate for the time necessary for the tungsten carbides to form.

21. A process in accordance with claim 20, wherein the process is carried out at a reactor pressure of 2–150 kPa and temperature of the substrate of 400–800° C., a ratio of tungsten hexafluoride to hydrogen is 0.01–0.3, and the substrate is annealed at 800–1200° C. in a vacuum of not more than 0.01 Pa.

22. A process in accordance with claim 21, wherein the annealing of the substrate is carried out at 1100–1200° C., producing a coating consisting of an internal layer of tungsten monocarbide WC and an external tungsten layer.

23. A process in accordance with claim 21, wherein the annealing of the substrate is carried out at 1000–1100° C., producing a coating consisting of an internal layer of tungsten monocarbide WC and tungsten semicarbide $W_2C$ and an external tungsten layer.

24. A process in accordance with claim 21, wherein the annealing of the substrate is carried out at 950–1000° C., producing a coating consisting of an external layer of tungsten monocarbide WC, tungsten semicarbide $W_2C$ and tungsten subcarbide $W_3C$, and an external tungsten layer.

25. A process in accordance with claim 21, wherein the annealing of the substrate is earned out at 850–950° C., producing a coating consisting of an internal layer of tungsten monocarbide WC, tungsten semicarbide $W_2C$ and a mixture of tungsten subcarbides $W_3C$ and $W_{12}C$, and an external tungsten layer.

26. A process in accordance with claim 21, wherein the annealing of the substrate is carried out at 800–850° C., producing a coating consisting of an internal layer of tungsten monocarbide WC, tungsten semicarbide $W_2C$ and tungsten subcarbide $W_{12}C$, and an external tungsten layer.

\* \* \* \* \*